United States Patent
Elbaz et al.

(10) Patent No.: US 6,446,874 B1
(45) Date of Patent: Sep. 10, 2002

(54) METHOD OF FABRICATING AN ELECTRONIC MODULE OR LABEL, MODULE OR LABEL OBTAINED AND MEDIUM INCLUDING A MODULE OR LABEL OF THIS KIND

(75) Inventors: Didier Elbaz, Marseille; Jean Christophe Fidalgo, Gemenos, both of (FR)

(73) Assignee: Gemplus S.A., Inc., Gémenos (FR)

( * ) Notice: Subject to any disclaimer, the term of this patent is extended or adjusted under 35 U.S.C. 154(b) by 0 days.

(21) Appl. No.: 09/534,053

(22) Filed: Mar. 24, 2000

(51) Int. Cl.[7] ............................................. G06K 19/06
(52) U.S. Cl. ..................................... 235/492; 235/489
(58) Field of Search ............................... 235/492, 487, 235/488, 494, 486, 489; 361/736, 737

(56) References Cited

U.S. PATENT DOCUMENTS

| | | |
|---|---|---|
| 4,701,236 A | 10/1987 | Vieilledent |
| 5,027,190 A | 6/1991 | Haghiri-Tehrani et al. |
| 5,304,513 A | 4/1994 | Haghiri-Tehrani et al. |
| 5,677,524 A * | 10/1997 | Haghiri-Tehrani ............ 235/492 |
| 5,822,190 A * | 10/1998 | Iwasaki ........................ 235/488 |
| 5,969,951 A * | 10/1999 | Fisher et al. ................. 235/492 |
| 6,142,381 A * | 11/2000 | Finn et al. .................... 235/492 |
| 6,305,609 B1 * | 10/2001 | Melzer et al. ................ 235/487 |
| 6,330,162 B2 * | 12/2001 | Sakamoto et al. ........... 235/492 |

FOREIGN PATENT DOCUMENTS

| | | |
|---|---|---|
| EP | 0201952 | 11/1986 |
| EP | 0299530 | 1/1989 |

* cited by examiner

*Primary Examiner*—Michael G. Lee
*Assistant Examiner*—Daniel St. Cyr
(74) *Attorney, Agent, or Firm*—Burns, Doane, Swecker & Mathis, L.L.P.

(57) ABSTRACT

The present invention relates to a method of fabricating at least one electronic module or label which is adapted to be rendered adhesive. The method includes the following steps: an insulative film is supplied including at least one contact and/or antenna type interface, and an adhesive tape is supplied including an activatable adhesive and a removable protective film. The tape includes at least one perforation corresponding to the area of the resin on the module or label. The adhesive tape is applied to the support film so that the perforation coincides with the area of the resin and the adhesive is activated so that it fixes the tape to the film. The coating resin is dispensed over the intended area at least within the perforation and in contact with the perforation. The invention also provides a method in which the activatable adhesive is deposited with no protection film.

27 Claims, 5 Drawing Sheets

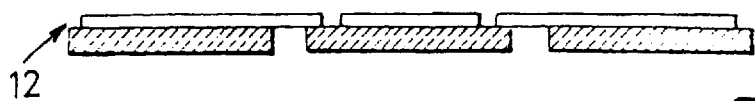
FIG.5A
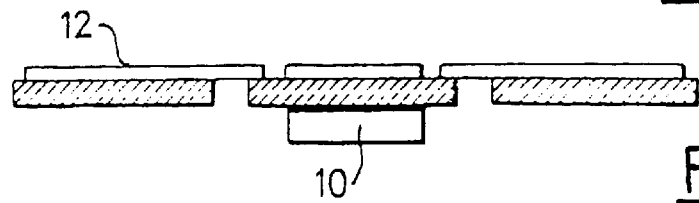
FIG.5B
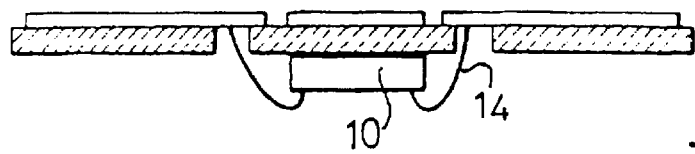
FIG.5C
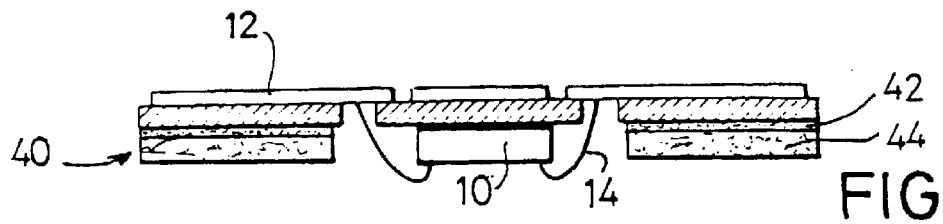
FIG.5D
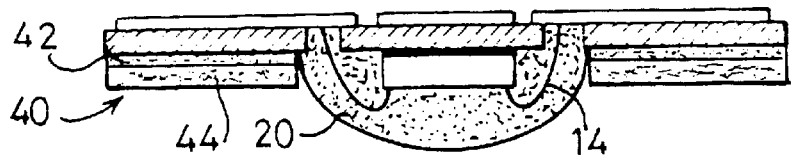
FIG.5E
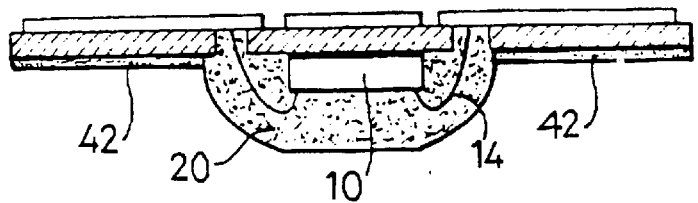
FIG.5F
FIG.5G
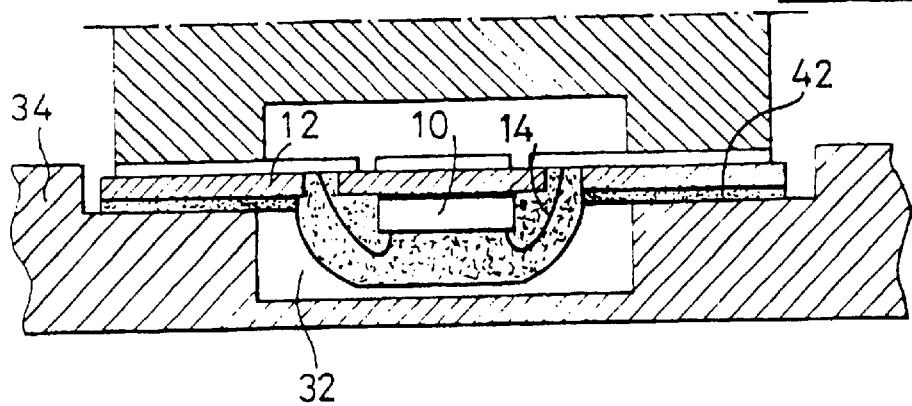

FIG.6A
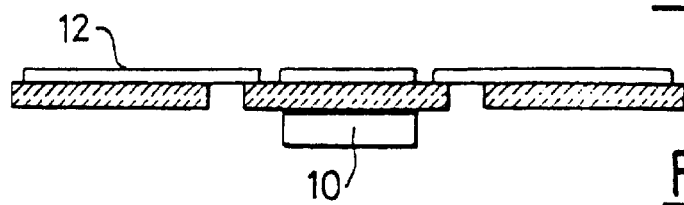
FIG.6B
FIG.6C
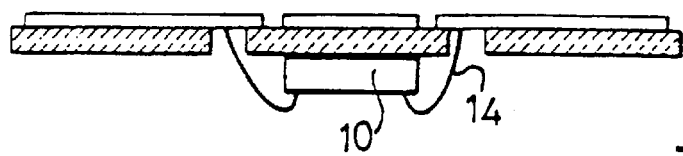
FIG.6D
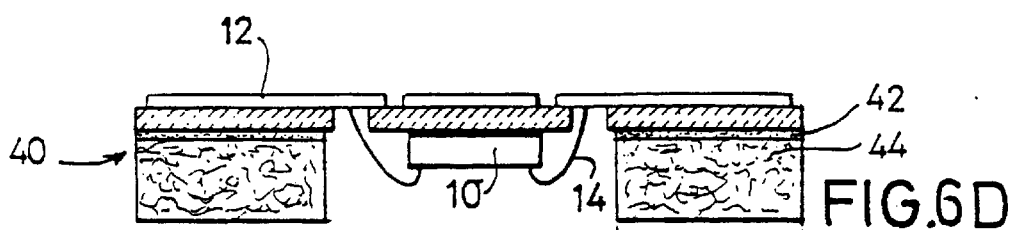
FIG.6E
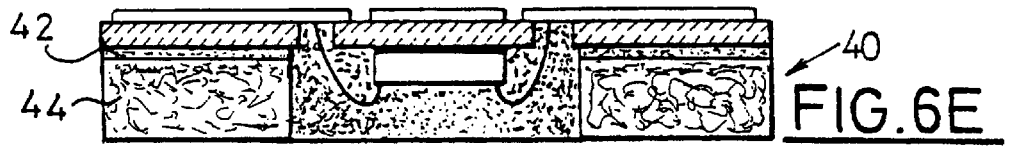
FIG.6F
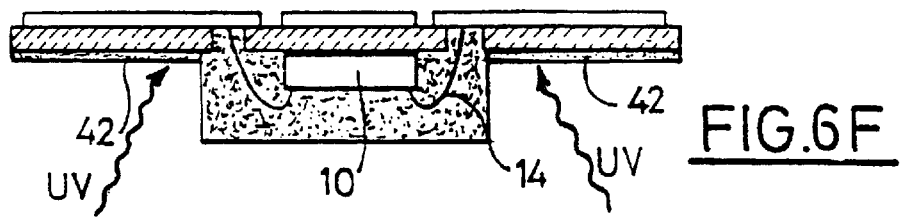
FIG.6G
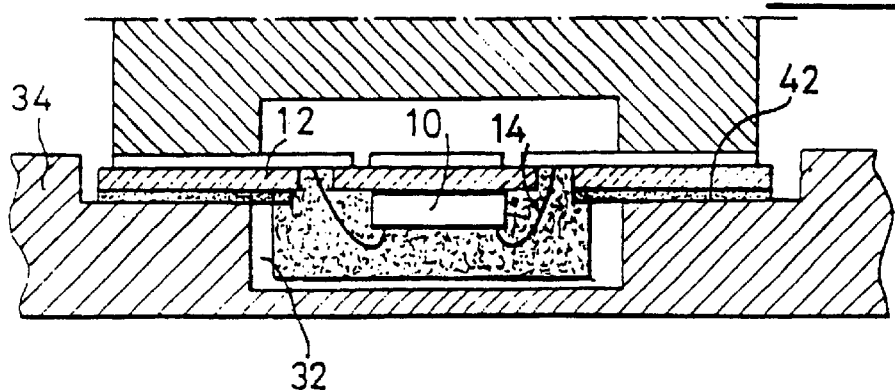

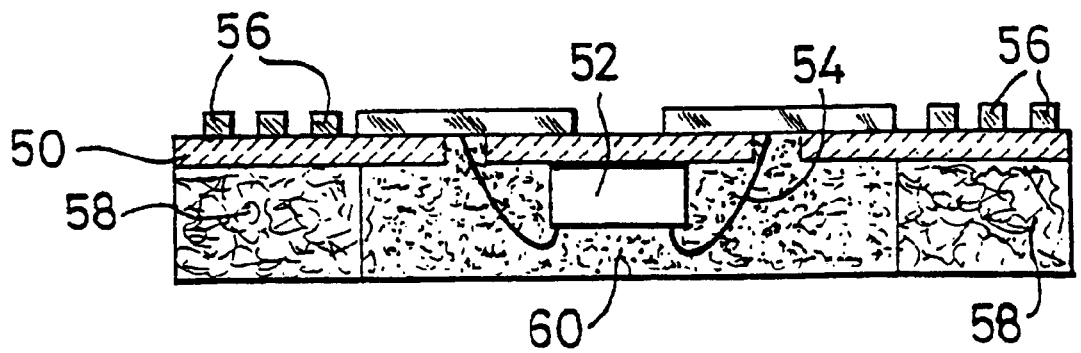
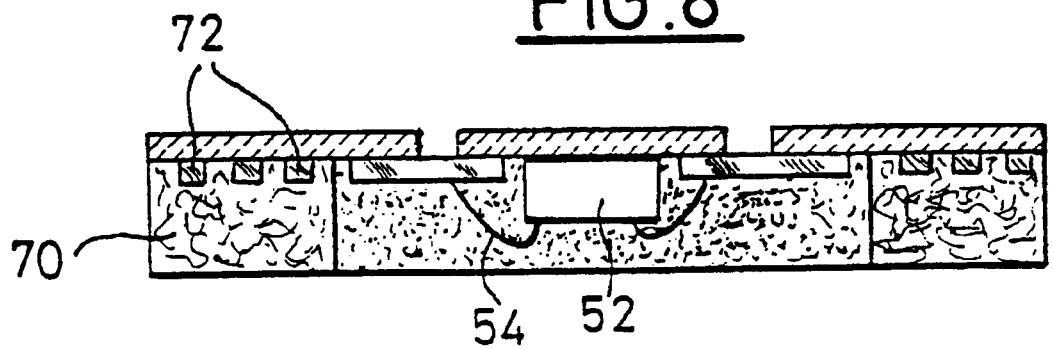
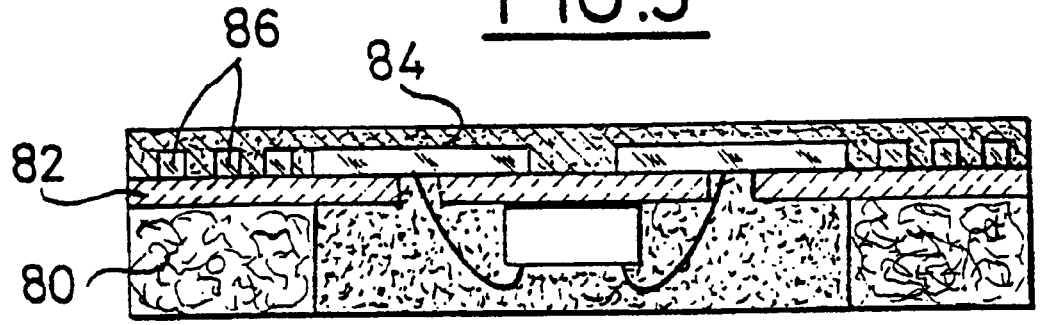

METHOD OF FABRICATING AN ELECTRONIC MODULE OR LABEL, MODULE OR LABEL OBTAINED AND MEDIUM INCLUDING A MODULE OR LABEL OF THIS KIND

This disclosure is based upon, and claims priority from, French Patent Application No. 97/12445, filed Sep. 26, 1997, the contents of which are incorporated herein by reference.

FIELD OF THE INVENTION

The present invention relates to the fabrication of electronic modules to be integrated into an electronic card, such as a smart card or an electronic label.

BACKGROUND OF THE INVENTION

The electronic module in a smart card or the like includes at least one microcircuit and an interface which can be a contact terminal assembly in the case of conventional contact-type smart cards or one or more antennas providing contactless communication in the case of contactless smart cards and electronic labels. In the case of hybrid smart cards, the interface includes a contact terminal assembly and an antenna.

One standard process for fabricating smart cards produces electronic modules in series on a continuous support film which is then cut up to fix the modules into a cavity formed in the body of the card. To be more precise, microcircuits or chips are glued to the support film carrying an interface and the connections from the microcircuit to the interface are then made. The connections and the chip are then covered with a coating, in particular a drop of thermosetting resin providing mechanical protection.

This is followed by an operation of fixing the electronic module into the cavity in the card, usually referred to as "carding". An adhesive such as a cyanoacrylate glue or even a heat-activated adhesive can be placed in the cavity for this purpose. Alternatively, a heat-activated adhesive can be hot-laminated onto the film after the coating operation and before cutting out the module. The adhesive is then re-activated by hot pressing once the module has been placed in the cavity.

The protective resin for small chips is usually deposited directly onto the support film. In contrast, for large microcircuits, and in particular rectangular ones, in order to obtain a reproducible shape it is necessary to delimit the surface of the drop of resin by means of a "barrier" deposited around the electronic module. The use of a barrier facilitates depositing the resin and in some cases removes the need for the milling operation that is otherwise necessary to obtain the final thickness of the module.

The barrier can be a polymer (epoxy, silicone, polyester) barrier deposited by means of a syringe ("dispensed") or by screenprinting. The barrier can instead be a pressed metal frame glued to the support film.

The technique using a barrier has a number of drawbacks. Firstly, its cost is relatively high and adds to the unit cost of the electronic card. In the case of a silicone barrier, there are secondary effects (pollution of the surfaces to be glued). The operation of depositing the resin must be carefully controlled to prevent the resin overflowing, which constitutes a cause of rejection. Finally, it is difficult to dispense with the milling operation in the case of thermosetting resins.

To avoid the above drawbacks, another process includes steps of cold laminating a perforated adhesive tape onto the support film, casting a resin in the openings formed by the perforations in the adhesive tape by a process referred to as "shuttering", setting the thickness by stamping, if necessary, and peeling off the adhesive tape.

SUMMARY OF THE INVENTION

This process uses a particular consumable, namely the adhesive tape, which is of non-negligible cost. Also, to reduce the cost of this technology, the adhesive tape must be cut and applied and the resin must be deposited and the tape removed on the same machine. What is more, not even the slightest residue of adhesive on the film can be tolerated as this may compromise the "carding" operation. These two objectives are difficult to achieve with high efficiency, the slightest offset in the registration of the adhesive tape leading to a high reject rate. It is difficult to apply a cold adhesive which must be peeled off after coating without the adhesive beginning to peel in the vicinity of the cutout, which causes the resin to leak beyond the intended area.

Another technique is described in European Patent Application EP-A-0 201 952. It includes the steps of cold laminating a perforated adhesive tape onto a film that is bare and/or incorporates the chip and/or the connecting wires, said tape consisting of a mass of adhesive and a removable protective film, spraying a varnish onto the protective film coating the chip and the connections in this way, removing the protective film, which has served as a mask, cutting out the module using a punch/die-type tool and placing the module directly in the cavity.

This process is difficult to use and its mechanical reliability is debatable. During cutting, the remaining mass of adhesive may stick to the die and/or the card. A second protective film with openings corresponding to the modules is then placed over the mass of adhesive.

This process has the drawbacks of involving too many process steps and of requiring a specific consumable, in the form of the second film, and is therefore costly to implement.

The problem addressed by the invention is that of providing a simple, reliable and economic method of fabricating electronic modules for electronic cards.

The proposed solution aims not only to reduce the number of process steps but also to eliminate the use of consumables. To this end, the principle of the invention is to use the adhesive employed for fixing as a barrier to or delimiter of the coating resin.

To this end, the invention provides a method of fabricating at least one electronic module or label which is adapted to be rendered adhesive, said module or label including a support film, at least one microcircuit and at least one interface of the contact and/or antenna type connected together by connections and disposed on the support film, a coating resin protecting at least said microcircuit and said connections, said coating resin being disposed over a predetermined area, and an external activatable adhesive, said method including the following steps:

a) an insulative film is supplied including at least one contact and/or antenna type interface, b) an adhesive tape is supplied including an activatable adhesive and a removable protective film, said tape including at least one perforation corresponding to the area of the resin on the module or label, c) the adhesive tape is applied to the support film so that said perforation coincides with the area of the resin and said adhesive is activated so that it fixes the tape to the film, and d) the coating resin is dispensed over the intended area at least within the perforation and in contact with the perforation, the microcircuit having been fixed to the support film connected to the interface after one of the preceding steps.

In the case of series fabrication of media provided with an electronic module, such as smart cards, or with a label, the preceding steps are performed, the support film and the tape are provided in roll form, the former including a plurality of interfaces, the latter including a plurality of perforations. The protective layer is then removed from the adhesive tape and the modules or labels are cut out before gluing them to a support of the body of the card by activating the adhesive tape.

The method according to the invention is particularly advantageous for fabricating smart cards since no dedicated consumable material is used for shuttering the resin, because the fixing adhesive is used for this purpose, and the number of process steps is reduced, because the separate operation of depositing the barrier is eliminated. Also, equipment and processes known in the art are used, which facilitates industrial application.

Minimising the number of process steps increases efficiency and reduces fabrication cost.

In the case of small microcircuits, for which a barrier is not normally used, the invention increases the volume of resin around the connecting wires and thus provides a form of packaging which is more rigid and therefore more resistant to mechanical stresses (repeated bending and twisting). This increase in reliability is achieved with no increase in unit cost.

The adhesive tape can be applied to the support film at various stages, including before gluing the microcircuits to the support film, after gluing the microcircuits and before connecting them, or after connecting them.

According to another feature of the invention, the total thickness of the adhesive tape with its external protective layer is at least equal to the intended thickness of the protective or coating resin. This enables the resin to be well contained to the required height.

The height of the barrier is preferably matched to the required height of the resin simply by varying the thickness of the protective film. Thus a very thin layer of adhesive can be used, which is preferable in particular in the fabrication of smart cards in respect of the gluing or the dynamic behaviour of the module relative to the cavity.

The coating material, which is a resin, can be dispensed in various ways, in particular by spraying, screenprinting, positive displacement dispensing (Glob Top), etc.

Positive displacement dispensing provides total control of the predetermined quantity of resin deposited and consequently its thickness. Unlike spraying, this technique provides total control over the dispensing region on the support film, in particular in the intended area within any form of perforation, barrier or delimitation.

A variant of the method of the invention differs from the previous embodiment described above in that it includes the following steps:

b) an activatable adhesive with no external protective film is supplied, c) the adhesive is deposited so that it is distributed over all of the support film and defines a delimitation around said area and said adhesive is activated so that it adheres to the support film, and d) the coating resin is dispensed over the intended area inside said delimitation so that the coating resin stops spreading when it comes into contact with it, the microcircuit having been fixed to the support film and connected to the interface after one of the preceding steps.

This eliminates the need for a protective film and the step of removing such film prior to fixing.

For fixing the module or antenna to a support, the method of the invention further includes a step of activating the adhesive prior to or at the same time as it is applied to and pressed onto said support.

The support is preferably a smart card or token body incorporating a cavity adapted to receive at least one microcircuit, its connections and said coating resin.

The invention also provides an electronic module or label obtained by the above methods. In the case of an electronic module including an antenna, the antenna can be formed on the rear face of the support film, in which case the module includes a second adhesive tape applied to the rear face of the support film.

This second adhesive tape constitutes a protective layer for the antenna.

The invention further provides an electronic label incorporating an electronic module in which the interface is an antenna and which is obtained by the above method. A label of this kind is constituted entirely by the electronic module, which is not "carded" and retains the external protective layer. The adhesive tape is advantageously used to fix the label to a product support.

An adhesive electronic label of low unit cost is obtained in this way.

To stiffen the label, the adhesive tape can be reinforced, for example with glass fibres.

The invention further provides a smart card or token made by the methods according to the invention.

According to one feature of the invention, a standard smart card can be obtained by enclosing the module entirely within a support cavity, in particular a card body, so that the module is flush with the surface of the support.

According to one advantageous feature of the invention, the smart card or token includes a cavity adapted to receive at least one microcircuit, its connections and said coating resin and the support film is fixed to the surface of said support outside the cavity. Thus it is easy to fix a large label or module (interface with an antenna size of a few centimetres) to a card body without requiring a specific wide cavity on the support film.

The invention further provides a spool of support film carrying a plurality of modules or labels obtained by the method according to the methods of the invention.

Other features and advantages of the invention will emerge from the following description, which is given by way of illustrative and non-limiting example, and with reference to the accompanying drawings, in which:

BRIEF DESCRIPTION OF DRAWING

FIGS. 5A to 5G shows a method in accordance with the invention of fabricating smart cards, FIGS. 6A to 6G shows a first embodiment of the invention, and FIGS. 7 and 9 show other embodiments of the invention.

FIGS. 1A to 1J shows a conventional method of making an electronic module for use in a smart card. Microcircuits 10 are cut out from a wafer and glued to a support film 12 (see also FIG. 2). Interface connections 14 are made to constitute the electronic module.

Figure 1:
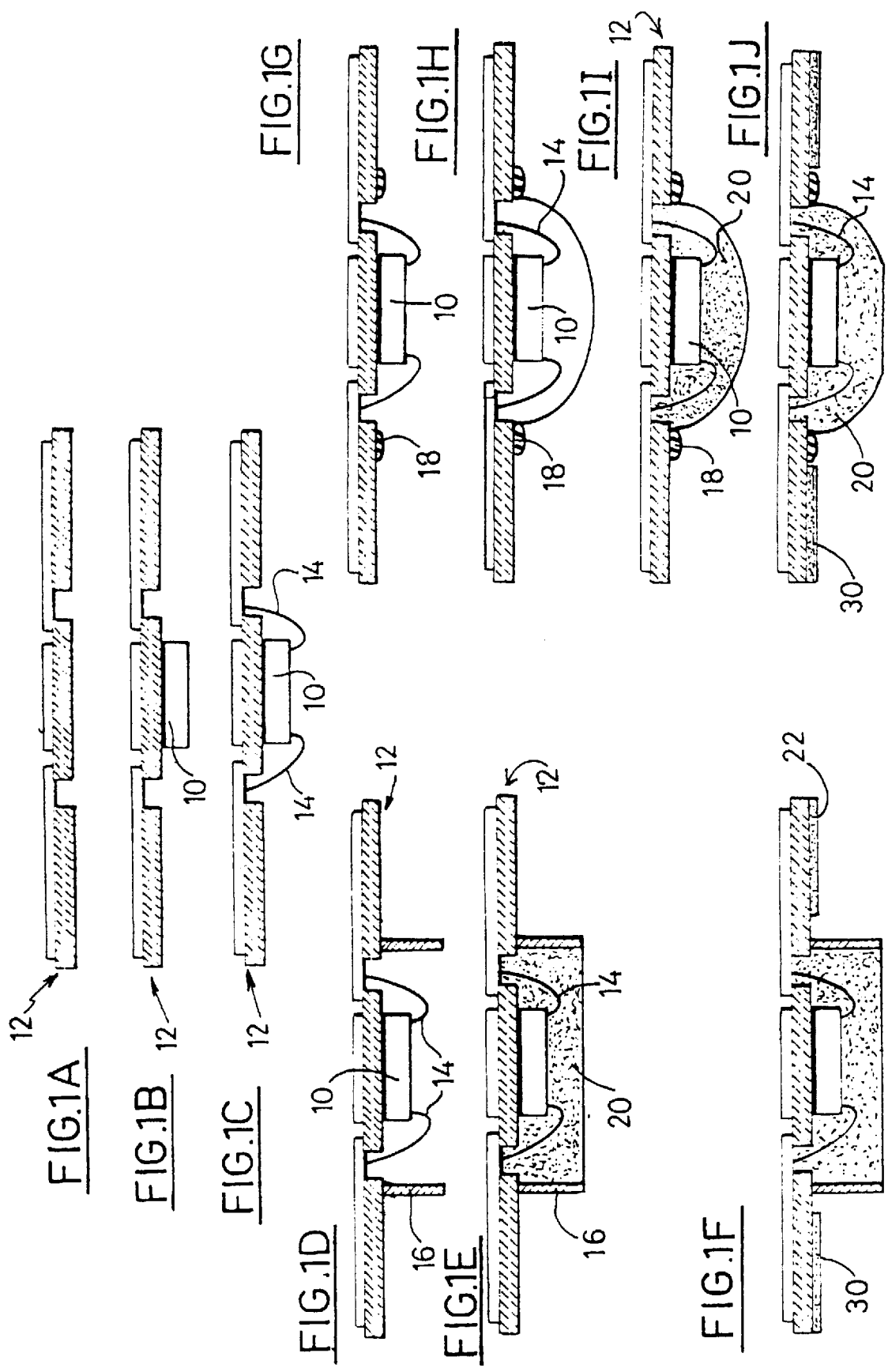
FIGS. 1A to 1J show a conventional method of fabricating an electronic module with two embodiments of the barrier.

Then, if the microcircuit is large and rectangular, a barrier is formed on the support film 12 around the electronic module obtained in the above manner. In the method shown in FIGS. 1D to 1F, the barrier is a pressed metal frame 16 glued to the support film 12; in the method shown in FIGS. 1G to 1J, the barrier 18 is a polymer, such as epoxy or polyester resin, or silicone, which can be deposited by a deposition technique using a syringe ("dispensed") or by screenprinting.

A drop 20 of resin for mechanically protecting the electronic module is then deposited on the support film 12 in the area delimited by the barrier 16 or 18.

An adhesive film 22 is then applied around the electronic module coated with the drop 20 of protective resin ready for the operation of inserting the electronic module into the body of the smart card.

Figure 2:
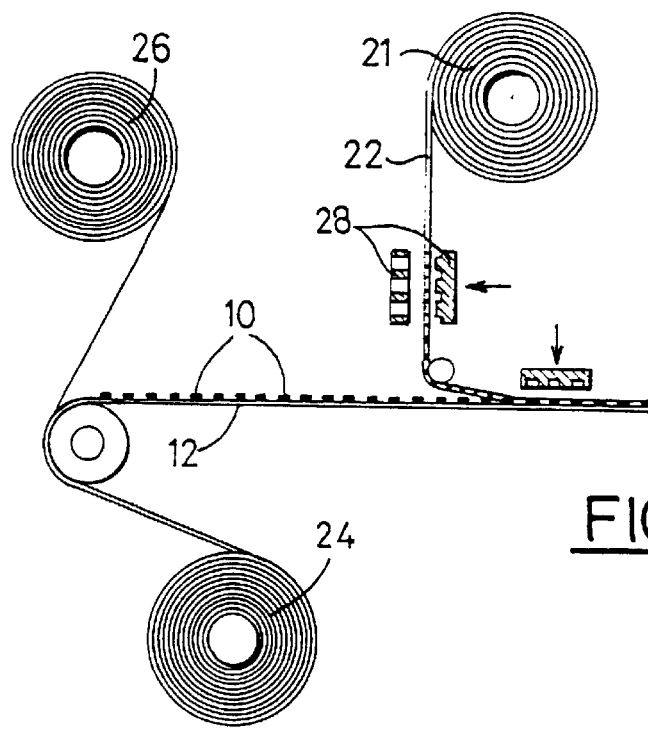
FIG. 2 shows the operation of depositing the adhesive tape.

FIG. 2 shows the operation of applying the adhesive film 22. It shows a roll 24 carrying a series of microcircuits 10 on a support film 12 and protected by an interleaved film 26. The interleaved film 26 is removed and wound onto an auxiliary spool. A third roll 21 supplies the adhesive film 22 which is perforated by a device 28 to form cut-outs corresponding to the areas of the electronic modules coated with the drop 20 of protective resin, with the result that the adhesive film 22 is made up of frames 30 surrounding this area.

Figure 3:
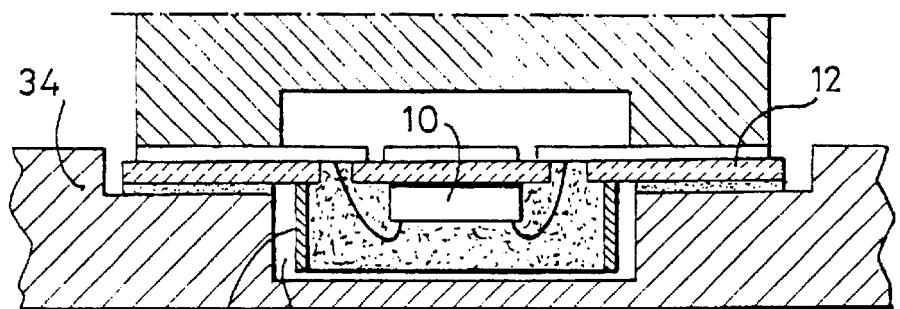
FIGS. 3 and 4 show the "carding" operation for both embodiments of the barrier.
Figure 4:
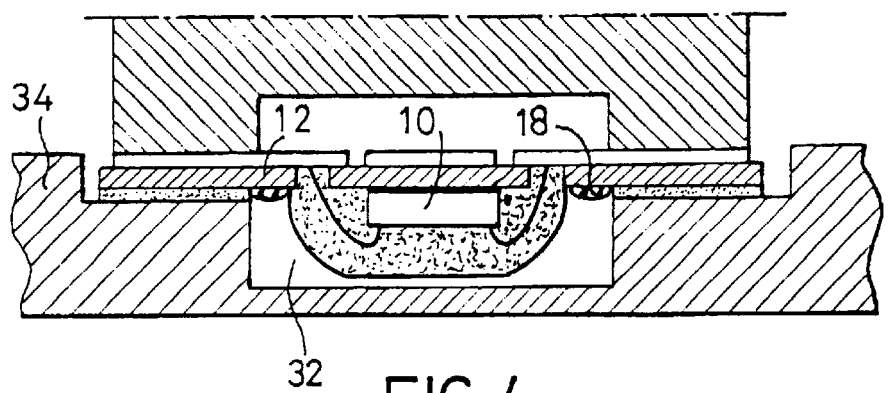

The support film 12 is then cut to obtain individual electronic modules which are then glued into a recess 32 in the body 34 of the smart card by the adhesive film 22 that has just been applied. This operation is shown in FIGS. 3 and 4 for both embodiments of the barriers 16 and 18.

In the case of thermosetting resins, it may be necessary to correct the thickness of the electronic module coated with the drop 20 of protective resin before the cutting operation, for example by milling the drop 20 of protective resin.

As indicated above, the conventional technique of forming the barrier has many drawbacks. The cost of this operation is not negligible.

The material used can have harmful secondary effects; if silicone is used, for example, surfaces to be glued in subsequent process steps may become polluted.

A precise technique for depositing the resin must be used to prevent the resin overflowing, which leads to rejection.

The use of thermosetting resins entails an additional operation of correcting the thickness of the electronic module coated with the drop 20 of protective resin.

As indicated above, there are other techniques for producing the barrier which necessitate the use of a consumable material and/or additional process steps increasing fabrication cost.

The present invention avoids the aforementioned drawbacks and produces an electronic module coated with the drop 20 of protective resin at reduced fabrication cost. The principle of the invention is to use the adhesive film employed for the subsequent "carding" operation to form the barrier. There is therefore no consumable material; furthermore, the dedicated step of forming the barrier is eliminated.

FIGS. 5A to 5G show one embodiment of the electronic module according to the present invention coated with the drop 20 of protective resin. FIGS. 5A to 5C show the two steps of producing the support film 12, the step of gluing on the microcircuit or chip 10 and the step of making the interface connections 14.

According to the invention, an adhesive tape 40 which is perforated, for example like the adhesive film 22 shown in FIG. 2, and is made up of a layer 42 of adhesive covered with an external protection layer 44, is then applied to the support film 12. The drop 20 of protective resin is then applied, after which the external protection layer 44 is removed to glue the electronic module into the recess 32 in the body 34 of the smart card.

This embodiment uses a layer 42 of heat-activated, thermoplastic or heat-activated adhesive, for example BEIERSDORF TESA 8410 adhesive.

The operation of applying the adhesive tape 40 to the support film 12 is performed before depositing the drop 20 of protective resin; it can be performed before gluing the chip 10, before making the connections 14 or, at the latest, after this latter step. All that is required is to use techniques for gluing the chip and wiring the connections which do not require a temperature that could activate the layer 42 of adhesive.

For example, a two-component glue which is cross-linked at room temperature can be used to glue the chips, or a glue which is cross-linked by ultraviolet radiation or light at a shorter wavelength ("blue light"). The prior art "wedge bonding" technique can be used for wiring the connections, employing an aluminium wire welded ultrasonically. Another solution is "ball bonding" using suitable parameter settings and avoiding a temperature greater than 70° C. in the area of the layer 42 of adhesive.

The adhesive tape 40 includes an external protection layer 44, i.e. an external non-stick surface preventing unintentional gluing during the steps of fabrication of the electronic module.

Moreover, the thickness of the adhesive tape 40 with its external protection layer 44 is chosen to be not less than the intended thickness of the drop 20 of protective resin. A thinner adhesive tape 40 can be used if the drop 20 of protective resin is deposited by a positive displacement dispensing type deposition technique providing total control of the quantity of resin deposited and consequently its thickness.

The protective resin must be cross-linked at a low temperature. It can be activated by ultraviolet radiation, cross-linked by wetting or a two-component product.

In the case of a thin adhesive tape, the rheological properties and the surface tension of the resin are such that a convex drop is reproducibly obtained. In other cases the term "resin" as used in the context of the invention can refer to any material adapted to protect the microcircuit and its connections.

After the drop 20 of protective resin has been gelled or completely cross-linked, the external protection layer 44 is removed to perform the "carding" operation in the conventional way. In the case of a thin external protection layer 44, the thickness of the drop 20 of protection resin can be corrected by milling.

FIGS. 6A to 6G show another embodiment using a layer 42 of adhesive cross-linked by ultraviolet radiation and is based on the use of a thermosetting polymer (for example an epoxy or urethane polymer) whose polymerisation is initiated by ultraviolet radiation, possibly associated with a thermoplastic formulation (for example polyester) to render the product activatable, the product becoming tacky when heated. As shown in FIG. 6, the layer 42 of adhesive is activated by ultraviolet radiation after removing the external protection layer 44 and just before fitting it into the cavity 32 in the body 34. It is therefore not necessary to apply a high temperature to polymerise the layer 42 of adhesive. This means that the deformation of the back of the cavity 32 usually caused by pressing at high temperature is significantly reduced compared to the use of an adhesive which is cross-linked by applying heat.

The advantage of this adhesive is that it can be exposed to a temperature in the order 80 to 120° C. without degrading it; this means that a thermosetting protective resin can be cast and polymerised in the recesses formed by the perforations in the adhesive tape 40.

The invention can therefore produce electronic modules including an interface of the contact terminal assembly or antenna type. In the case of an electronic module whose interface is an antenna, the invention can produce electronic labels for marking commercial products, for example in large retail outlets. Such electronic labels are used in particular to detect products entering a surveillance area. The external protection layer 44 of the labels is not removed so that users can choose whether to retain it or not. However, in a preferred embodiment aimed at series fixing of modules or labels to products such as chip supports or industrial products, the protective film must be removed before cutting. In one example, the module is cut out by a punch and transferred to an insertion tool for fixing it to the product concerned.

The adhesive layer of the adhesive tape can be used for gluing the electronic label to the product.

FIG. 7 shows an electronic label of this kind which includes a support film 50, a microcircuit 52, connections 54 to an antenna 56 consisting of metal turns deposited on the rear face of the support film 50, and an adhesive tape 58. The microcircuit 52 is embedded in a drop 60 of protective resin.

In this case, the adhesive tape 58 produces a label of constant thickness. An adhesive tape reinforced by means of glass fibres, for example, can be used if a stronger label is required.

The antenna is made of metal tape, for example copper or aluminium tape, chemically etched or stamped on a dielectric, for example glass/epoxy, polyester, polyimide, polyethylene, polypropylene.

The antenna can be on the same side as the microcircuit (front face of the support film 50) or the other side (rear face).

In the former case, as shown in FIG. 8, the adhesive tape 70 protects the turns of the antenna 72 from climatic conditions which can degrade the characteristics of the antenna, for example through corrosion, and mechanical abrasion. Also, the labels can be manipulated without interfering with operation by grounding or short-circuiting the turns.

In the latter case, as shown in FIG. 9, the adhesive tape 80 forming the barrier is applied to the support film 82 and a protective film 84 protecting the antenna 86 can be applied to its rear face.

The invention provides a low-cost electronic module for smart cards of the contact, contactless or hybrid type. In particular, no consumable material is used and the number of fabrication process steps is reduced.

Furthermore, the method of the invention uses conventional equipment and fabrication process steps, which makes it more reliable.

Also, an electronic label of great reliability in terms of mechanical strength can be obtained, also at low cost.

In the embodiment of the method of the invention using an activatable adhesive (44), the adhesive can be applied in various manners, in particular in the form of stripes or spots.

Likewise, the adhesive can be applied in the form of a film such as a thermofusible film. This film can be perforated like the film of the protective tape.

The adhesive can be a multilayer film. The adhesive layers can be activated differently, in particular by radiation or by heat.

One practical dispensing method uses the screenprinting technique.

Depending on the process, when the adhesive is heat-activated, the coating resin can be a single-component resin or a two-component polymer which is polymerised at a temperature of 70° C. or less.

What is claimed is:

1. A method of fabricating at least one electronic module or label which is adapted to be rendered adhesive, said module or label including a support film, at least one microcircuit and at least one contact interface and/or antenna interface connected together by connections and disposed on the support film, a coating resin protecting the at least one microcircuit and said connections, said coating resin being disposed over a predetermined area, and an external activatable adhesive, said method comprising steps of:

a) supplying an insulative support film including at least one contact interface and/or antenna interface;

b) supplying an adhesive tape including an activatable adhesive and a removable protective film, said tape including at least one perforation corresponding to the area of the resin on the module or label;

c) applying the adhesive tape to the support film so that said perforation coincides with the area of the resin and said adhesive is activated so that the adhesive fixes the tape to the support film; and d) dispensing the coating resin over an intended area at least within the perforation and in contact with the perforation.

2. The method according to claim 1, wherein a predetermined quantity of the coating resin is dispensed over the intended area.

3. The method according to claim 1, further including a step in which the support film is cut to extract said module from the support film and said protective film is removed from the tape.

4. The method according to claim 1 further including a step in which the support film is cut to extract said module from the support film.

5. The method according to claim 1, wherein a total thickness of the adhesive tape with the protective film is not less than an intended thickness of the coating resin.

6. The method according to claim 1, wherein said adhesive is heat-activated and the coating resin can be polymerised by irradiation.

7. The method according to claim 1, wherein the adhesive is heat-activated and the coating resin is a single-component resin which can be polymerised at a temperature of 70° C. or less.

8. The method according to claim 1, wherein the adhesive is heat-activated and the coating resin is a two-component polymer which can be polymerised at a temperature of 70° C. or less.

9. The method according to claim 1, wherein said adhesive is a multilayer film.

10. The method according to claim 1, further including the step of fixing the module or antenna to a support by activating the adhesive before or at the same time as applying the adhesive to and pressing the adhesive onto said support.

11. The method according to claim 18, wherein said support is a smart card or token body incorporating a cavity intended to receive at least one microcircuit and said coating resin.

12. The method of claim 1, further including the step of affixing the microcircuit to the support film and connecting the microcircuit to the interface after one of steps a-d.

13. The method according to claim 12, wherein the adhesive tape is applied before the step of affixing the microcircuit to the support film.

14. The method according to claim 12, wherein the adhesive tape is applied after affixing the microcircuit and before connecting the microcircuit.

15. The method according to claim 12, wherein the adhesive tape is applied after connecting the microcircuit.

16. A method of fabricating at least one electronic module or label which is adapted to be rendered adhesive, said module or label including a support film, at least one microcircuit and at least one contact interface and/or antenna interface connected together by connections and disposed on the support film, a coating resin protecting the at least one microcircuit and said connections, said coating resin being disposed over a predetermined area, and an external activatable adhesive, said method comprising steps of:
   a) supplying a support film including at least one contact interface and/or antenna interface;
   b) supplying an activatable adhesive;
   c) depositing the adhesive so that the adhesive is distributed over all of the support film and defines a delimitation around said area and said adhesive is activated so that the adhesive adheres to the support film; and
   d) dispensing the coating resin over an intended area inside said delimitation so that the coating resin stops spreading when the coating resin comes into contact with the adhesive.

17. The method according to claim 16, wherein said adhesive is applied in a form of stripes or spots.

18. The method according to claim 16, wherein said adhesive is a thermofusible film incorporating at least one perforation corresponding to said area.

19. The method according to claim 17, wherein said adhesive is deposited by screenprinting.

20. The method of claim 16, further including the step of affixing the microcircuit to the support film and connecting the microcircuit to the interface after one of steps a-d.

21. The method according to claim 16, further including a step of cutting the support film to extract said module from the support film.

22. The method according to claim 16, wherein said adhesive is heat-activated and the coating resin can be polymerised by irradiation.

23. The method according to claim 16, wherein the adhesive is heat-activated and the coating resin is a single-component resin which can be polymerised at a temperature of 70° C. or less.

24. The method according to claim 16, wherein the adhesive is heat-activated and the coating resin is a two-component polymer which can be polymerised at a temperature of 70° C. or less.

25. The method according to claim 16, wherein said adhesive is a multilayer film.

26. The method according to claim 16, further including the step of fixing the module or antenna to a support by activating the adhesive before or at the same time as applying the adhesive to said support and pressing the adhesive onto said support.

27. The method according to claim 26, wherein said support is a smart card or token body incorporating a cavity intended to receive at least one microcircuit and said coating resin.

* * * * *

UNITED STATES PATENT AND TRADEMARK OFFICE
CERTIFICATE OF CORRECTION

PATENT NO.    : 6,446,874 B1
DATED         : September 10, 2002
INVENTOR(S)   : Didier Elbaz et al.

It is certified that error appears in the above-identified patent and that said Letters Patent is hereby corrected as shown below:

<u>Title page,</u>
Add the Foreign Application information:

-- [30]  Foreign Patent Application Data
France  97/12445  09/26/1997
PCT PCT/FR98/02052  09/23/1998 --

Signed and Sealed this

Twenty-fifth Day of March, 2003

JAMES E. ROGAN
*Director of the United States Patent and Trademark Office*